US008646407B2

(12) United States Patent
Matsuura

(10) Patent No.: US 8,646,407 B2
(45) Date of Patent: Feb. 11, 2014

(54) FILM FORMATION APPARATUS FOR SEMICONDUCTOR PROCESS AND METHOD FOR USING THE SAME

(75) Inventor: Hiroyuki Matsuura, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/530,941

(22) Filed: Jun. 22, 2012

(65) Prior Publication Data

US 2012/0263888 A1    Oct. 18, 2012

Related U.S. Application Data

(62) Division of application No. 11/987,108, filed on Nov. 27, 2007, now abandoned.

(30) Foreign Application Priority Data

Nov. 30, 2006 (JP) ................................. 2006-323805

(51) Int. Cl.
| | |
|---|---|
| *C23C 16/00* | (2006.01) |
| *C23C 16/52* | (2006.01) |
| *C23C 16/50* | (2006.01) |
| *C23C 16/34* | (2006.01) |
| *C23C 16/455* | (2006.01) |

(52) U.S. Cl.
USPC ........... 118/697; 118/696; 118/715; 118/724; 118/725; 118/723 E; 118/723 R; 427/569; 427/579; 427/255.394; 438/775

(58) Field of Classification Search
USPC .................. 118/715, 724, 725, 723 R, 723 E, 118/723 ER, 696, 697; 427/569, 570, 573, 427/574, 579, 255.18, 255.23, 255.28, 427/255.29, 255.394; 438/770, 769, 775
See application file for complete search history.

(56) References Cited

U.S. PATENT DOCUMENTS

| 7,098,147 B2 | 8/2006 | Nansei et al. |
|---|---|---|
| 7,378,358 B2 | 5/2008 | Igeta et al. |

(Continued)

FOREIGN PATENT DOCUMENTS

| JP | 03-293726 | 12/1991 |
|---|---|---|
| JP | 04-192330 | 7/1992 |

(Continued)

OTHER PUBLICATIONS

Japanese Office Action issued on Feb. 14, 2012 in Japanese Patent Application No. 2006-323805 (with English translation).

(Continued)

*Primary Examiner* — Jeffrie R Lund
(74) *Attorney, Agent, or Firm* — Oblon, Spivak, McClelland, Maier & Neustadt, L.L.P.

(57) ABSTRACT

A method is provided for using a film formation apparatus including a process container having an inner surface, which contains as a main component a material selected from the group consisting of quartz and silicon carbide. The method includes performing a film formation process to form a silicon nitride film on a product target substrate inside the process container, and then, unloading the product target substrate from the process container. Thereafter, the method includes supplying an oxidizing gas into the process container with no product target substrate accommodated therein, thereby performing an oxidation process to change by-product films deposited on the inner surface of the process container into a composition richer in oxygen than nitrogen, at a part of the by-product films from a surface thereof to a predetermined depth.

10 Claims, 6 Drawing Sheets

(56) References Cited

U.S. PATENT DOCUMENTS

| | | |
|---|---|---|
| 7,938,080 B2 * | 5/2011 | Noro et al. ............... 118/696 |
| 7,964,516 B2 * | 6/2011 | Okada et al. ............. 438/787 |
| 7,981,809 B2 | 7/2011 | Shibata et al. |
| 8,025,931 B2 * | 9/2011 | Chou et al. ............... 427/569 |
| 8,178,448 B2 * | 5/2012 | Nodera et al. ............ 438/792 |
| 8,216,648 B2 * | 7/2012 | Matsunaga et al. ....... 427/579 |
| 8,336,490 B2 * | 12/2012 | Matsuura et al. ......... 118/723 I |
| 2005/0221001 A1 | 10/2005 | Joe et al. |
| 2006/0213539 A1 | 9/2006 | Hasebe et al. |
| 2008/0132083 A1 * | 6/2008 | Matsuura ................... 438/770 |
| 2009/0124087 A1 * | 5/2009 | Nodera et al. ............ 438/710 |
| 2009/0181550 A1 * | 7/2009 | Hasebe et al. ............ 438/791 |
| 2011/0129618 A1 * | 6/2011 | Matsunaga et al. ....... 427/579 |
| 2011/0129619 A1 * | 6/2011 | Matsunaga et al. ....... 427/579 |
| 2012/0263888 A1 * | 10/2012 | Matsuura ................... 427/579 |

FOREIGN PATENT DOCUMENTS

| | | |
|---|---|---|
| JP | 2004-111739 | 4/2004 |
| JP | 2006-173236 | 6/2006 |
| KR | 10-2005-0057255 | 6/2005 |
| KR | 10-2006-0067843 | 6/2006 |

OTHER PUBLICATIONS

Korean Office Action mailed on Aug. 18, 2011 in Korean Patent Application No. 10-2007-122580 (with English translation).

* cited by examiner

US 8,646,407 B2

FILM FORMATION APPARATUS FOR SEMICONDUCTOR PROCESS AND METHOD FOR USING THE SAME

CROSS-REFERENCE TO RELATED APPLICATIONS

The present application is a divisional of U.S. application Ser. No. 11/987,108, filed on Nov. 27, 2007, the entire contents of which is incorporated herein by reference. U.S. application Ser. No. 11/987,108 claims the benefit of priority under 35 U.S.C. 119 from Japanese Application No. 2006-323805 filed Nov. 30, 2006.

BACKGROUND OF THE INVENTION

1. Field of the Invention

The present invention relates to a film formation apparatus for a semiconductor process for forming a silicon nitride film on a target substrate, such as a semiconductor wafer, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices, a process, such as CVD (Chemical Vapor Deposition), is performed to form a thin film, such as a silicon nitride film, on a target substrate, such as a semiconductor wafer. For example, a film formation process of this kind is arranged to form a thin film on a semiconductor wafer, as follows.

At first, the interior of the process container (reaction tube) of a heat processing apparatus is heated by a heater at a predetermined load temperature, and a wafer boat that holds a plurality of semiconductor wafers is loaded. Then, the interior of the process container is heated up to a predetermined process temperature, and gas inside the process container is exhausted through an exhaust port, so that the pressure inside the process container is decreased to a predetermined pressure.

Then, while the interior of the process container is kept at the predetermined temperature and pressure (kept exhausted), a film formation gas is supplied through a process gas feed line into the process container. For example, in the case of CVD, when a film formation gas is supplied into a process container, the film formation gas causes a thermal reaction and thereby produces reaction products. The reaction products are deposited on the surface of each semiconductor wafer, and form a thin film on the surface of the semiconductor wafer.

Reaction products generated during the film formation process are deposited (adhered) not only on the surface of the semiconductor wafer, but also on, e.g., the inner surface of the process container and other members, the latter being as by-product films. If the film formation process is continued while by-product films are present on the inner surface of the process container, a stress is generated and causes peeling of some of the by-product films and the quartz of the process container due to a difference in coefficient of thermal expansion between the quartz and by-product films. Consequently, particles are generated, and may decrease the yield of semiconductor devices to be fabricated and/or deteriorate some components of the processing apparatus.

In order to solve this problem, cleaning of the interior of the process container is performed after the film formation process is repeated several times. In this cleaning, the interior of the process container is heated at a predetermined temperature by a heater, and a cleaning gas, such as a mixture gas of fluorine and a halogen-containing acidic gas, is supplied into the process container. The by-product films deposited on the inner surface of the process container are thereby dry-etched and removed by the cleaning gas. Jpn. Pat. Appln. KOKAI Publication No. 3-293726 discloses a cleaning method of this kind.

In order to prevent particle generation in a heat processing apparatus, it is preferable to frequently perform cleaning thereon, e.g., to clean the interior of the heat processing apparatus every time a thin film is formed on semiconductor wafers. However, in this case, the downtime of the heat processing apparatus becomes larger and thereby deteriorates productivity.

BRIEF SUMMARY OF THE INVENTION

An object of the present invention is to provide a film formation apparatus for a semiconductor process and a method for using the same, which can prevent particle generation without lowering the productivity.

According to a first aspect of the present invention, there is provided a method for using a film formation apparatus including a process container having an inner surface, which contains as a main component a material selected from the group consisting of quartz and silicon carbide, the method comprising: performing a film formation process to form a silicon nitride film on a product target substrate inside the process container; then, unloading the product target substrate from the process container; and then, supplying an oxidizing gas into the process container with no product target substrate accommodated therein, thereby performing an oxidation process to change by-product films deposited on the inner surface of the process container into a composition richer in oxygen than nitrogen, at a part of the by-product films from a surface thereof to a predetermined depth.

According to a second aspect of the present invention, there is provided a film formation apparatus for a semiconductor process, comprising: a process container configured to accommodate a target substrate and having an inner surface, which contains as a main component a material selected from the group consisting of quartz and silicon carbide, a heater configured to heat the target substrate inside the process container; an exhaust system configured to exhaust gas from inside the process container; a film formation gas supply circuit configured to supply a film formation gas for forming a silicon nitride film into the process container; an oxidizing gas supply circuit configured to supply an oxidizing gas for performing an oxidation process on by-product films into the process container; a mechanism configured to load and unload the target substrate to and from the process container; a control section configured to control an operation of the apparatus, wherein the control section is preset to execute a method that comprises performing a film formation process to form a silicon nitride film on a product target substrate inside the process container; then, unloading the product target substrate from the process container; and then, supplying an oxidizing gas into the process container with no product target substrate accommodated therein, thereby performing an oxidation process to change by-product films deposited on the inner surface of the process container into a composition richer in oxygen than nitrogen, at a part of the by-product films from a surface thereof to a predetermined depth.

According to a third aspect of the present invention, there is provided a computer readable medium containing program instructions for execution on a processor, which is used for a film formation apparatus including a process container having an inner surface, which contains as a main component a material selected from the group consisting of quartz and silicon carbide, wherein the program instructions, when executed by the processor, control the film formation apparatus to execute a method that comprises performing a film formation process to form a silicon nitride film on a product target substrate inside the process container; then, unloading the product target substrate from the process container; and then, supplying an oxidizing gas into the process container with no product target substrate accommodated therein, thereby performing an oxidation process to change by-product films deposited on the inner surface of the process container into a composition richer in oxygen than nitrogen, at a part of the by-product films from a surface thereof to a predetermined depth.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
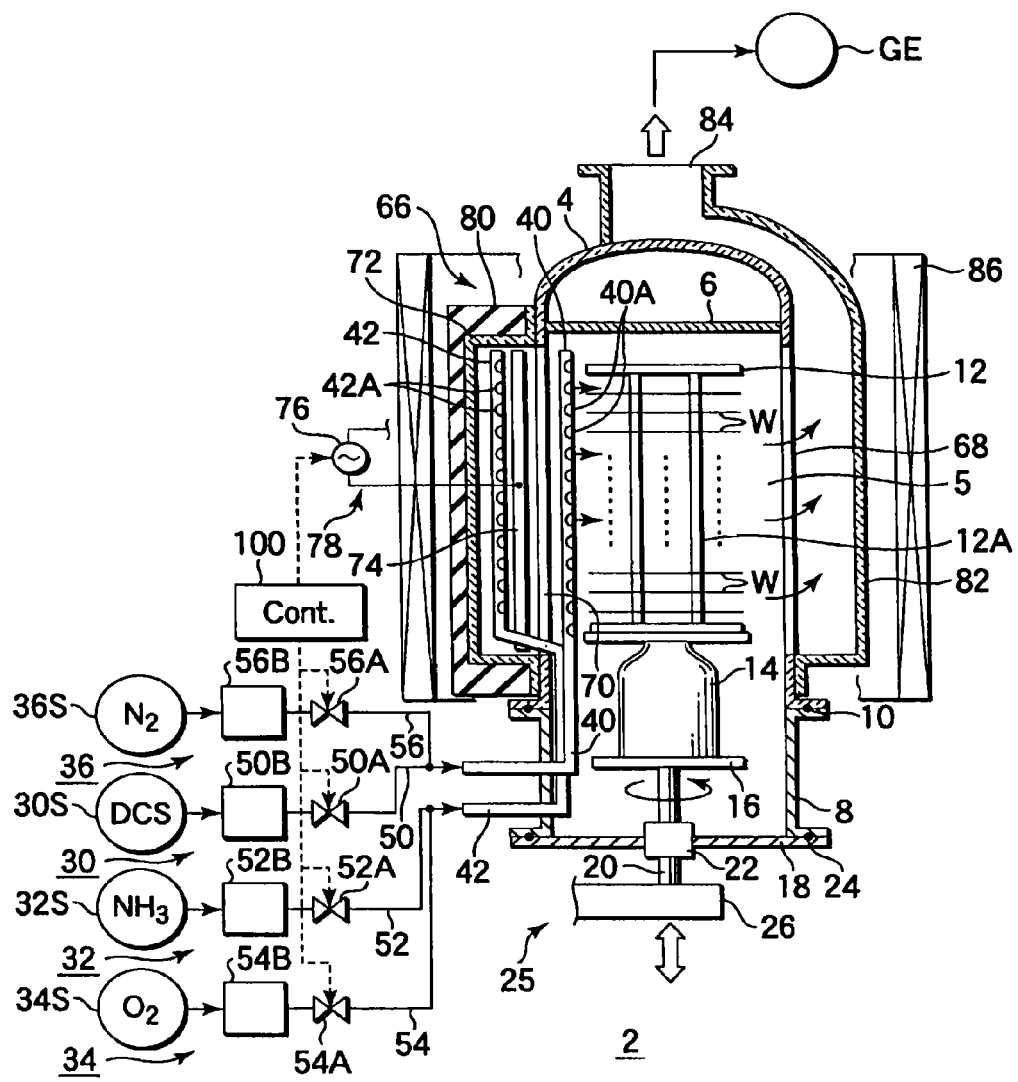
FIG. 1 is a sectional view showing a film formation apparatus (vertical CVD apparatus) according to an embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

Figure 2:
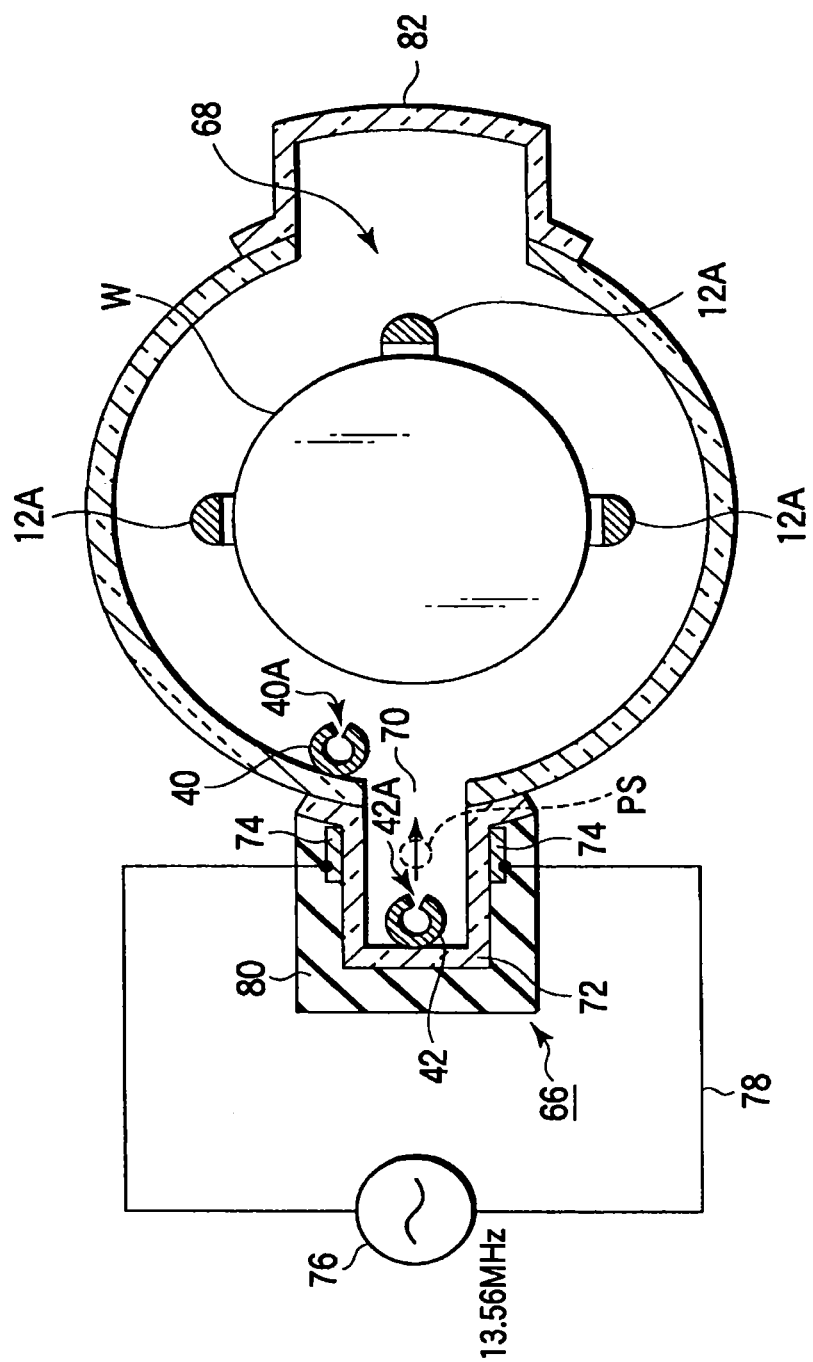
FIG. 2 is a sectional plan view showing part of the apparatus shown in FIG. 1.

FIG. 1 is a sectional view showing a film formation apparatus (vertical CVD apparatus) according to an embodiment of the present invention. FIG. 2 is a sectional plan view showing part of the apparatus shown in FIG. 1. The film formation apparatus 2 has a process field configured to be selectively supplied with a first process gas comprising dichlorosilane (DCS: $SiH_2Cl_2$) gas as a silicon source gas, a second process gas comprising ammonia ($NH_3$) gas as a nitriding gas, and a third process gas comprising oxygen ($O_2$) gas as an oxidizing gas for an auxiliary process. The film formation apparatus 2 is configured to form a silicon nitride film on target substrates by CVD in the process field. Ammonia gas is also used as a nitriding gas (fourth process gas) for an auxiliary process, but ammonia gas will be explained in relation only to the second process gas, unless otherwise necessary.

The film formation apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz (or silicon carbide (SiC)). The top of the process container 4 is provided with a ceiling plate 6 made of the same material to airtightly seal the top. The bottom of the process container 4 is connected through a seal member 10, such as an O-ring, to a cylindrical manifold 8. The process container may also be formed as a single unit, i.e., a cylindrical quartz (or silicon carbide) column that includes a manifold 8.

The manifold 8 is made of, e.g., stainless steel, and supports the bottom of the process container 4. A wafer boat 12 made of quartz (or silicon carbide) is moved up and down through the bottom port of the manifold 8, so that the wafer boat 12 is loaded/unloaded into and from the process container 4. The wafer boat 12 is configured to support a number of target substrates or semiconductor wafers W stacked at intervals in the vertical direction. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz (or silicon carbide). The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a first process gas supply circuit 30, a second process gas supply circuit 32, a third process gas supply circuit 34, and an inactive gas supply circuit 36. The first process gas supply circuit 30 is arranged to supply a first process gas comprising a silicon source gas, such as dichlorosilane (DCS: $SiH_2Cl_2$) gas. The second process gas supply circuit 32 is arranged to supply a second process gas comprising a nitriding gas, such as ammonia ($NH_3$) gas. The third process gas supply circuit 34 is arranged to supply a third process gas comprising an oxidizing gas for an auxiliary process, such as oxygen ($O_2$) gas. The inactive gas supply circuit 36 is arranged to supply an inactive gas, such as $N_2$ gas, as an inactive gas for dilution, purge, or pressure control. Each of the first to third process gases may be mixed with a suitable amount of carrier gas (dilution gas, such as $N_2$ gas), as needed. However, such a carrier gas will not be mentioned, hereinafter, for the sake of simplicity of explanation.

More specifically, the first process gas supply circuit 30 and inactive gas supply circuit 36 include a common gas distribution nozzle 40, and the second and third process gas supply circuits 32 and 34 include a common gas distribution nozzle 42. Each of the gas distribution nozzles 40 and 42 is formed of a quartz (or silicon carbide) pipe which penetrates the sidewall of the manifold 8 from the outside and then turns and extends upward (see FIG. 1). The gas distribution nozzles 40 and 42 respectively have a plurality of gas spouting holes 40A and 42A, each set of holes being formed at predetermined intervals in the longitudinal direction (the vertical direction) over all the wafers W on the wafer boat 12. Each of the gas spouting holes 40A and 42A delivers the corresponding process gas almost uniformly in the horizontal direction, so as to form gas flows parallel with the wafers W on the wafer boat 12.

The first process gas supply circuit 30 and inactive gas supply circuit 36 may have respective gas distribution nozzles. Similarly, the second and third process gas supply circuits 32 and 34 may have respective gas distribution nozzles.

The nozzle 40 is connected to gas sources 30S and 36S of DCS gas and $N_2$ gas, respectively, through gas supply lines (gas passages) 50 and 56, respectively.

The nozzle 42 is connected to gas sources 32S and 34S of $NH_3$ gas and $O_2$ gas, respectively, through gas supply lines (gas passages) 52 and 54, respectively. The gas supply lines 50; 52, 54, and 56 are provided with switching valves 50A, 52A, 54A, and 56A and flow rate controllers 50B, 52B, 54B, and 56B, such as mass flow controllers, respectively. With this arrangement, DCS gas, $NH_3$ gas, $O_2$ gas, and $N_2$ gas can be supplied at controlled flow rates.

A gas exciting section 66 is formed at the sidewall of the process container 4 in the vertical direction. On the side of the process container 4 opposite to the gas exciting section 66, a long and thin exhaust port 68 for vacuum-exhausting the inner atmosphere is formed by cutting the sidewall of the process container 4 in, e.g., the vertical direction.

Specifically, the gas exciting section 66 has a vertically long and thin opening 70 formed by cutting a predetermined width of the sidewall of the process container 4, in the vertical direction. The opening 70 is covered with a quartz (or silicon carbide) cover 72 airtightly connected to the outer surface of the process container 4 by welding. The cover 72 has a vertically long and thin shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction.

A pair of long and thin electrodes 74 are disposed on the opposite outer surfaces of the cover 72, and face each other while extending in the longitudinal direction (the vertical direction). The electrodes 74 are connected to an RF (Radio Frequency) power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzle 42 of the second and third process gases is bent outward in the radial direction of the process container 4, at a position lower than the lowermost wafer W on the wafer boat 12. Then, the gas distribution nozzle 42 vertically extends at the deepest position (the farthest position from the center of the process container 4) in the gas exciting section 66. As shown also in FIG. 2, the gas distribution nozzle 42 is separated outward from an area sandwiched between the pair of electrodes 74 (a position where the RF electric field is most intense), i.e., a plasma generation area PS where the main plasma is actually generated. Each of the second process gas comprising $NH_3$ gas and the third process gas comprising $O_2$ gas is spouted from the gas spouting holes 42A of the gas distribution nozzle 42 toward the plasma generation area PS. Then, each of the second and third process gases is excited (decomposed or activated) in the plasma generation area PS, and is supplied in this state with radicals containing nitrogen atoms (N*, NH*, $NH_2$*, $NH_3$*) or radicals containing oxygen atoms (O*, $O_2$*) onto the wafers W on the wafer boat 12 (the symbol [*] denotes that it is a radical).

An insulating protection cover 80 made of, e.g., quartz (or silicon carbide) is attached to and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At a position near and outside the opening 70 of the gas exciting section 66, the gas distribution nozzle 40 of the first process gas and inactive gas is disposed. The gas distribution nozzle 40 extends vertically upward on one side of the outside of the opening 70 (in the process container 4). Each of the first process gas comprising DCS gas and the inactive gas comprising $N_2$ is spouted from the gas spouting holes 40A of the gas distribution nozzle 40 toward the center of the process container 4.

On the other hand, the exhaust port 68, which is formed opposite the gas exciting section 66, is covered with an exhaust port cover member 82. The exhaust port cover member 82 is made of quartz (or silicon carbide) with a U-shape cross-section, and attached by welding. The exhaust cover member 82 extends upward along the sidewall of the process container 4, and has a gas outlet 84 at the top of the process container 4. The gas outlet 84 is connected to a vacuum-exhaust system GE including a vacuum pump and so forth.

The process container 4 is surrounded by a heater 86, which is used for heating the atmosphere within the process container 4 and the wafers W. A thermocouple (not shown) is disposed near the exhaust port 68 in the process container 4 to control the heater 86.

Figure 3:
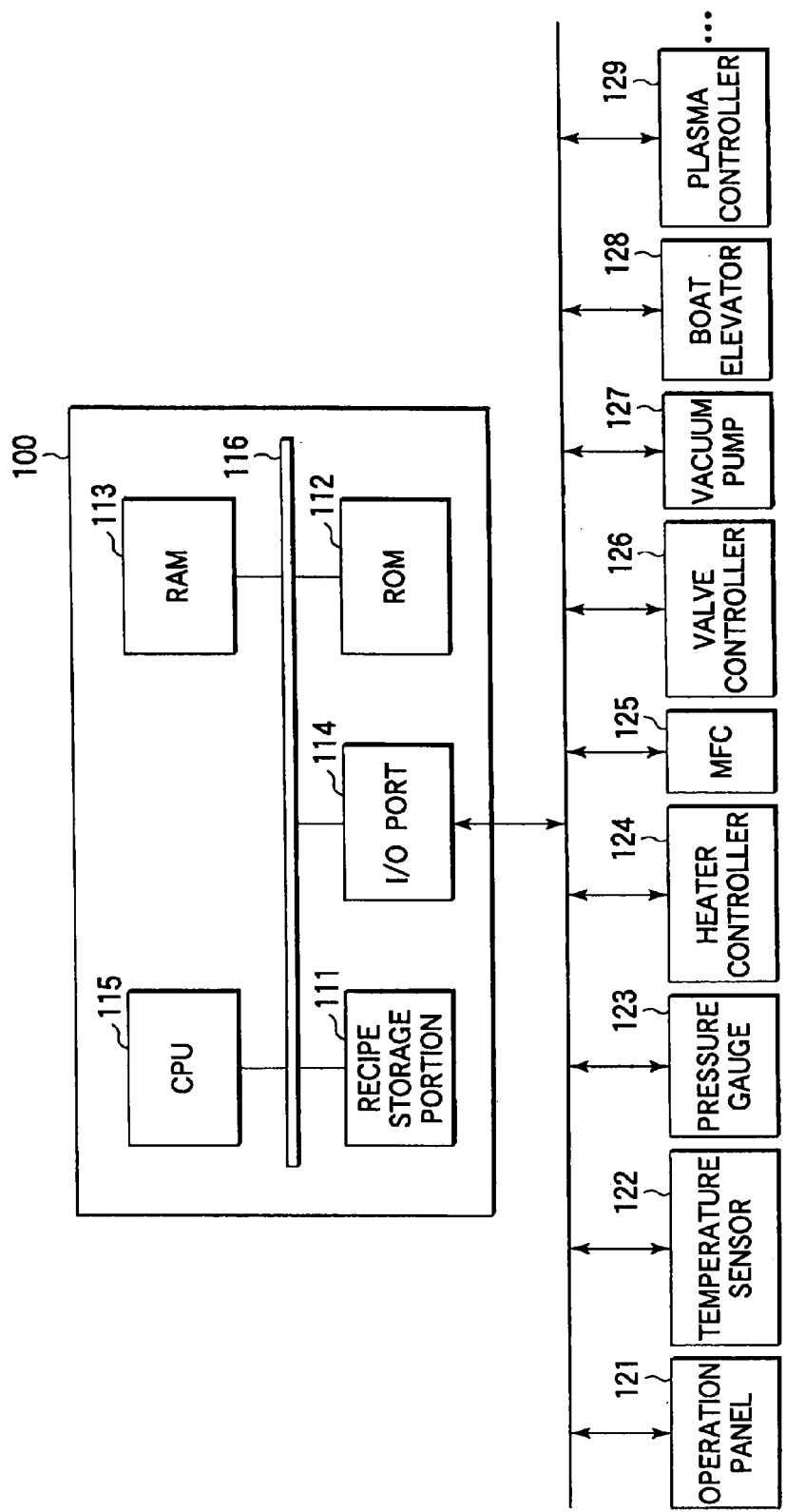
FIG. 3 is a view showing the structure of the main control section of the apparatus shown in FIG. 1.

The film formation apparatus 2 further includes a main control section 100 formed of, e.g., a computer, to control the entire apparatus. FIG. 3 is a view showing the structure of the main control section 100.

As shown in FIG. 3, the main control section 100 is connected to an operation panel 121, (a group of) temperature sensors 122, (a group of) pressure gages 123, a heater controller 124, MFCs 125 (corresponding to the flow rate controllers 50B, 52B, 54B, and 56B in FIG. 1), valve controllers 126, a vacuum pump 127 (corresponding to the vacuum-exhaust system GE in FIG. 1), a boat elevator 128 (corresponding to the elevating mechanism 25 in FIG. 1), a plasma controller 129, and so forth.

The operation panel 121 includes a display screen and operation buttons, and is configured to transmit operator's instructions to the main control section 100, and show various data transmitted from the main control section 100 on the display screen. The temperature sensors 122 are configured to measure the temperature at respective portions inside the process container 4 and exhaust line, and transmit measurement values to the main control section 100. The pressure gages 123 are configured to measure the pressure at respective portions inside the process container 4 and exhaust line, and transmit measurement values to the main control section 100.

The heater controller 124 is configured to control the respective sections of the heater 86. The heater controller 124 turns on the respective sections of the heater 86 to generate heat, in accordance with instructions from the main control section 100. The heater controller 124 is also configured to measure the power consumption of the respective sections of the heater 86, and transmit the readings to the main control section 100.

The MFCs 125 are respectively disposed on the piping of the gas supply lines. Each 125 is configured to control the flow rate of a gas flowing through the corresponding line in accordance with instructed values received from the main control section 100. Further, each MFC 125 is configured to measure the flow rate of a gas actually flowing, and transmit the reading to the main control section 100.

The valve controllers 126 are respectively disposed on the piping of the gas supply lines and configured to control the opening rate of valves disposed on the piping, in accordance with instructed values received from the main control section 100. The vacuum pump 127 is connected to the exhaust line, and configured to exhaust gas from inside the process container 4.

The boat elevator 128 is configured to move up the lid 18, so as to load the wafer boat 12 (semiconductor wafers W) placed on the rotary table 16 into the process container 4. The boat elevator 128 is also configured to move the lid 18 down, so as to unload the wafer boat 12 (semiconductor wafers W) placed on the rotary table 16 from the process container 4.

The plasma controller 129 is configured to control the gas exciting section 66 in accordance with instructions received from the main control section 100. Consequently, the plasma controller 129 controls generation of radicals of ammonia gas or oxygen gas, when the gas is supplied and activated in the gas exciting section 66.

The main control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the film formation apparatus 2 is manufactured, only the setup recipe is initially stored. The setup recipe is executed when a thermal model or the like for a specific film formation apparatus is formed. The process recipes are prepared respectively for heat processes to be actually performed by a user. Each process recipe prescribes temperature changes at respective portions, pressure changes inside the process container 4, start/stop timing for supply of process gases, and supply rates of process gases, from the time semiconductor wafers W are loaded into the process container 4 to the time processed wafers W are unloaded.

The ROM 112 is a storage medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFCs 125, valve controllers 126, vacuum pump 127, boat elevator 128, and plasma controller 129 and is configured to control output/input of data or signals.

The CPU (Central Processing Unit) 115 is the hub of the main control section 100. The CPU 115 is configured to run control programs stored in the ROM 112, and control an operation of the film formation apparatus 2, in accordance with a recipe (process recipe) stored in the recipe storage portion 111, following instructions from the operation panel 121. Specifically, the CPU 115 causes the temperature sensors 122, pressure gages 123, and MFCs 125 to measure temperatures, pressures, and flow rates at respective portions inside the process container 4 and exhaust line. Further, the CPU 115 outputs control signals, based on measurement data, to the heater controller 124, MFCs 125, valve controllers 126, and vacuum pump 127, to control the respective portions mentioned above in accordance with a process recipe.

Figure 4:
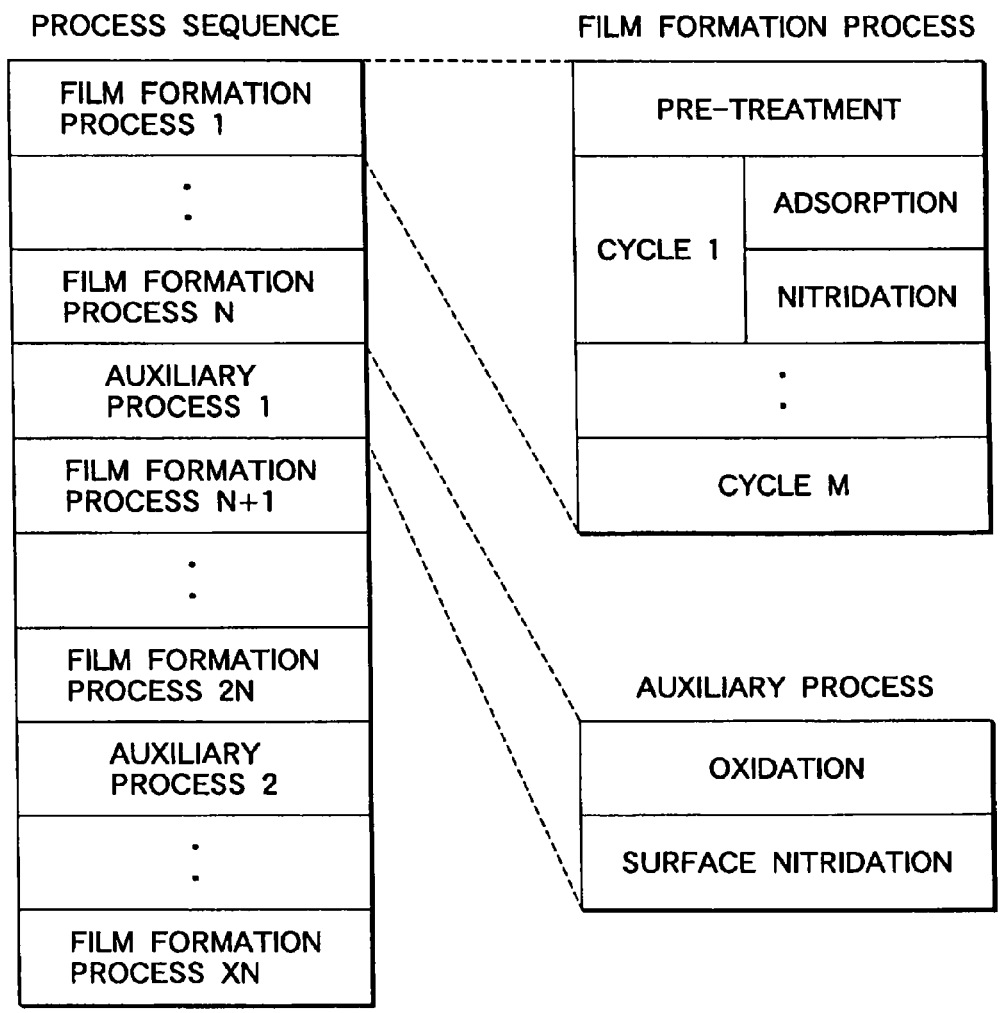
FIG. 4 is a view schematically showing a method for using the film formation apparatus according to the embodiment of the present invention.

Next, an explanation will be given of a method for using the film formation apparatus shown in FIG. 1 performed under the control of the main control section 100, wherein the method includes a film formation process (so called ALD (Atomic Layer Deposition) or MLD (Molecular Layer Deposition) film formation). FIG. 4 is a view schematically showing a method for using the film formation apparatus according to the embodiment of the present invention.

[Outline of Film Formation Process]

As shown in FIG. 4, in a method according to this embodiment, a film formation process is first performed to form a silicon nitride film on semiconductor wafers W by CVD. In the film formation process for each lot of wafers W, a first process gas comprising dichlorosilane (DCS: $SiH_2Cl_2$) gas as a silicon source gas and a second process gas comprising $NH_3$ gas as a nitriding gas are alternately supplied into the process field 5 accommodating wafers W.

The first process gas comprising DCS gas is supplied from the gas spouting holes 40 of the gas distribution nozzle 40 to form gas flows parallel with the wafers W on the wafer boat 12. While being supplied, molecules of DCS gas and molecules and atoms of decomposition products generated by gas decomposition are adsorbed on the pre-treated surface of the wafers W to form an adsorption layer (adsorption stage).

The second process gas comprising $NH_3$ gas is supplied from the gas spouting holes 42A of the gas distribution nozzle 42 to form gas flows parallel with the wafers W on the wafer boat 12. The second process gas is selectively excited and partly turned into plasma when it passes through the plasma generation area PS between the pair of electrodes 74. At this time, radicals containing nitrogen atoms ($N^*$, $NH^*$, $NH_2^*$, $NH_3^*$) are produced. The radicals flow out from the opening 70 of the gas exciting section 66 toward the center of the process container 4, and are supplied into gaps between the wafers W in a laminar flow state. When radicals containing nitrogen atoms are supplied onto the wafers W, they react with Si in the adsorption layer on the wafers W, and a thin film of silicon nitride is thereby formed on the wafers W (nitridation stage).

For each lot of wafers W, a cycle comprising the adsorption and nitridation stages described above is repeated a number of times, e.g., M=100 times, and thin films of silicon nitride formed by respective times are laminated, thereby arriving at a silicon nitride film having a target thickness.

[Outline of Auxiliary Process]

After the film formation process is repeated for an N-number of lots of wafers W (the film formation process is repeated an N-number of times), an auxiliary process is performed for by-product films, which contain silicon nitride as the main component (it means 50% or more), deposited inside the process container 4. The auxiliary process is performed before the cumulative film thickness of silicon nitride films obtained by repeating the film formation process a plurality of times exceeds a predetermined value. In the auxiliary process, the third process gas comprising $O_2$ gas as an oxidizing gas is first supplied, and the fourth process gas comprising $NH_3$ gas as a nitriding gas is then supplied, both into the process container 4 with no product target substrates accommodated therein.

The third process gas comprising $O_2$ gas is supplied from the gas spouting holes 42A of the gas distribution nozzle 42 to form gas flows parallel with the wafers W on the wafer boat 12. The third process gas is selectively excited and partly turned into plasma when it passes through the plasma generation area PS between the pair of electrodes 74. At this time, radicals containing oxygen atoms ($O^*$, $O_2^*$) are produced. The radicals flow out from the opening 70 of the gas exciting section 66 toward the center of the process container 4, and are supplied into gaps between the wafers W in a laminar flow state. With radicals containing oxygen atoms supplied onto the wafers W, an oxidation process is performed to change the by-product films into a composition richer in oxygen than nitrogen (silicon oxide or silicon oxynitride), at a part of the by-product films from the surface thereof to a depth of 1 to 10 nm, preferably 2 to 5 nm.

The fourth process gas comprising $NH_3$ gas is supplied from the gas spouting holes 42A of the gas distribution nozzle 42 to form gas flows parallel with the wafers W on the wafer boat 12. The fourth process gas is selectively excited and partly turned into plasma when it passes through the plasma generation area PS between the pair of electrodes 74. At this time, radicals containing nitrogen atoms ($N^*$, $NH^*$, $NH_2^*$, $NH_3^*$) are produced. The radicals flow out from the opening 70 of the gas exciting section 66 toward the center of the process container 4, and are supplied into gaps between the wafers W in a laminar flow state. With radicals containing nitrogen atoms supplied onto the wafers W, a surface nitridation process is performed to nitride and return a surface layer (with a thickness of 0.1 to 1 nm, preferably of 0.1 to 0.5 nm, and more preferably of 0.2 to 0.5 nm) of the oxidized by-product films into a composition richer in nitrogen than oxygen.

By performing the auxiliary process as described above, the by-product films is changed into a structure in which the inside is made of silicon oxide or the like and the surface layer is made of silicon nitride. In this case, the film contraction rate and film stress of the by-product films are alleviated to suppress film peeling. Consequently, it is possible to prevent particle generation without lowering the productivity.

Figure 5:
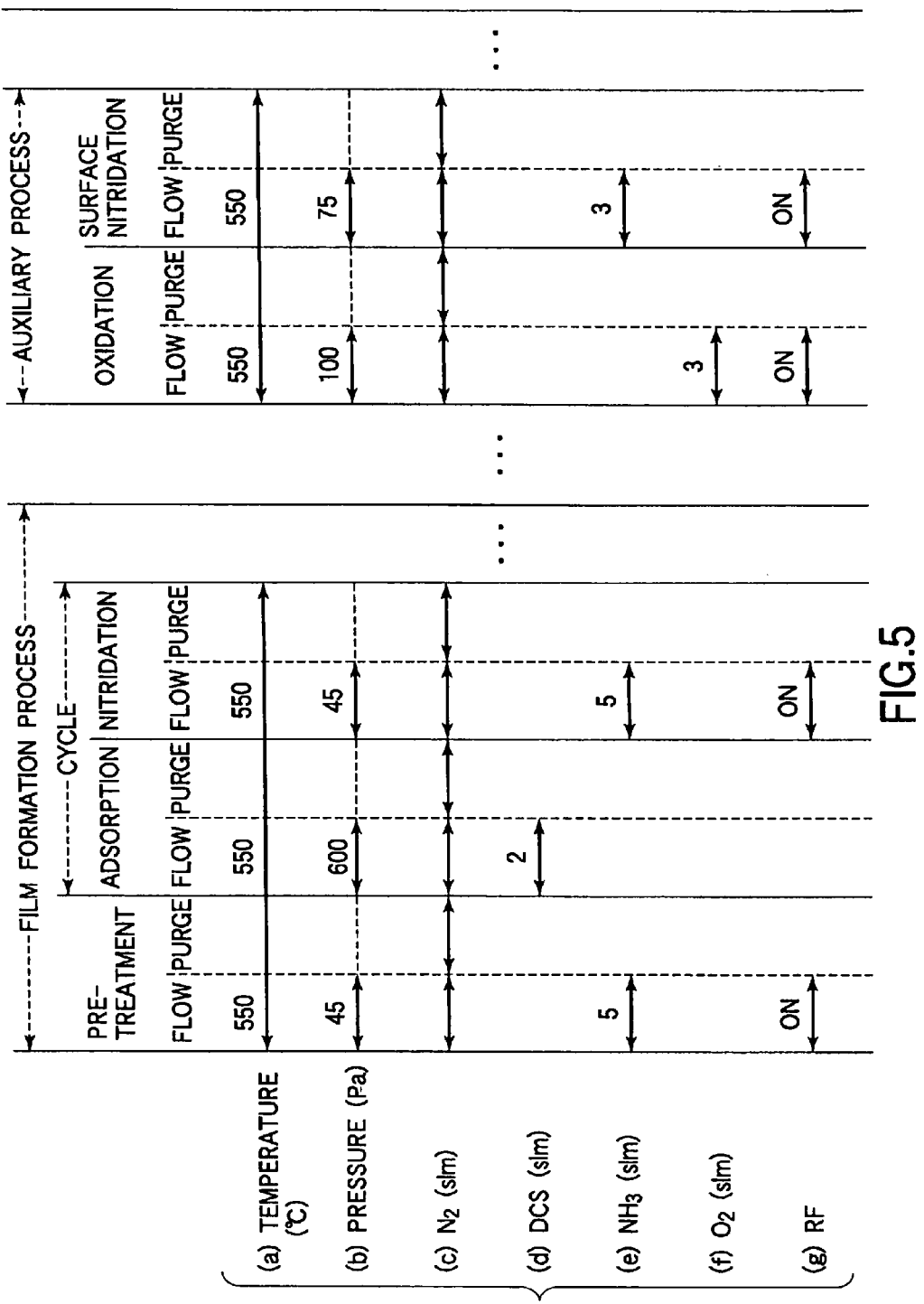
FIG. 5 is a timing chart showing the recipe of a film formation process and an auxiliary process according to the embodiment of the present invention.

FIG. 5 is a timing chart showing the recipe of a film formation process and an auxiliary process according to the embodiment of the present invention. The film formation process and auxiliary process will be explained in more detail below, with reference to FIG. 5.

[Film Formation Process]

At first, the wafer boat 12 at room temperature, which supports a number of, e.g., 50 to 100, wafers having a diameter of. 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, a pre-treatment stage is performed to treat the surface of the wafers W by ammonia radicals, as described below. During the film formation process comprising the pre-treatment stage and the adsorption and nitridation stages described above, the wafer boat 12 is kept rotated.

In the pre-treatment stage, at first, nitrogen gas is supplied into the process field 5 at a predetermined flow rate, as shown in FIG. 5, (c). Further, the process field 5 is set at a predetermined temperature, such as 550° C., as shown in FIG. 5, (a). At this time, the process field 5 is exhausted to set the process field 5 at a predetermined pressure, such as 45 Pa (0.34 Torr: 133 Pa=1 Torr), as shown in FIG. 5, (b). These operations are continued until the process field 5 is stabilized at the predetermined pressure and temperature (stabilization step).

When the process field 5 is stabilized at the predetermined pressure and temperature, an RF power is applied between the electrodes 11 (RF: ON), as shown in FIG. 5, (g). Further, ammonia gas is supplied to a position between the electrodes 11 (in the gas exciting section 66) at a predetermined flow rate, such as 5 slm (standard liter per minute), as shown in FIG. 5, (e). Ammonia gas thus supplied is excited (activated) into plasma between the electrodes 11 and generates ammonia radicals. The radicals thus generated are supplied from the gas exciting section 66 into the process field 5. Further, nitrogen gas is also supplied into the process field 5 at a predetermined flow rate, as shown in FIG. 5, (c) (flow step).

The temperature of the process field 5 is set to be 25° C. (room temperature) to 800° C. If the temperature is lower than room temperature, no nitride film may be formed. If the temperature is higher than 880° C., uniformity may be deteriorated in the quality and thickness of a silicon nitride film to be formed. The temperature of the process field 5 is preferably set to be 100 to 800° C. and more preferably to be 400 to 650° C. This temperature range makes it possible to further improve uniformity in the quality and thickness of a silicon nitride film to be formed.

The flow rate of ammonia gas is preferably set to be 10 sccm to 50 slm. This flow rate range makes it possible to generate plasma without difficulty and to supply radicals sufficient to perform the pre-treatment on the surface of the semiconductor wafers W.

The RF power is preferably set to be 10 to 1,500 W. If the power is lower than 10 W, it is difficult to generate radicals. If the power is higher than 1,500 W, the quartz (or silicon carbide) wall of the gas exciting section 66 may be damaged. The RF power is more preferably set to be 50 to 500 W, and furthermore preferably to be 100 to 500 W. This power range makes it possible to efficiently generate radicals.

The pressure of the process field 5 is preferably set to be 0.133 Pa (1 mTorr) to 13.3 kPa (100 Torr). This pressure range makes it possible to easily generate radicals and to increase the mean free path of radicals in the process field 5. The pressure of the process field 5 is more preferably set to be 40 to 100 Pa. This pressure range makes it possible to easily control the pressure of the process field 5.

After ammonia gas is supplied for a predetermined time period, the supply of ammonia gas is stopped and the application of RF power is stopped. On the other hand, nitrogen gas is kept supplied into the process field 5 at a predetermined flow rate, as shown in FIG. 5, (c). Further, the process field 5 is exhausted to exhaust gas therein out of the process field 5 (purge step).

It should be noted that, in light of the film formation sequence, the temperature of the process field 5 is preferably set to be constant during the film formation. Accordingly, in this embodiment, the temperature of the process field 5 is set at 550° C. over the pre-treatment, adsorption, and nitridation stages. Further, the process field 5 is kept exhausted over the pre-treatment, adsorption, and nitridation stages.

In the adsorption stage subsequently performed, at first, while nitrogen gas is supplied into the process field 5 at a predetermined flow rate, as shown in FIG. 5, (c), the process field 5 is set at a predetermined temperature, such as 550° C., as shown in FIG. 5, (a). At this time, the process field 5 is exhausted to set the process field 5 at a predetermined pressure, such as 600 Pa (4.6 Torr), as shown in FIG. 5, (b). These operations are continued until the process field 5 is stabilized at the predetermined pressure and temperature (stabilization step).

When the process field 5 is stabilized at the predetermined pressure and temperature, DCS gas is supplied into the process field 5 at a predetermined flow rate, such as 2 slm, as shown in FIG. 5, (d), and nitrogen gas is also supplied into the process field 5 at a predetermined flow rate, as shown in FIG. 5, (c) (flow step). DCS gas thus supplied into process field 5 is heated and thereby activated in the process field 5, and forms an adsorption layer on the surface of the wafers W.

In the pre-treatment stage, when the pre-treatment is performed on the surface of the wafers W by ammonia radicals, —OH groups and —H groups present on the surface of the wafers W are partly replaced with —NH$_2$ groups. Accordingly, when the adsorption stage is started, —NH$_2$ groups are present on the surface of the wafers W. When DCS is supplied in this state, the DCS is thermally activated and reacts with —NH$_2$ groups on the surface of the wafers W, thereby accelerating adsorption of Si on the surface of the wafers W.

The flow rate of DCS gas is preferably set to be 10 sccm to 10 slm. If the flow rate is lower than 10 sccm, DCS supply onto the wafers W may be insufficient.

If the flow rate is higher than 10 slm, the ratio of DCS contributory to adsorption onto the wafers W may become too low. The flow rate of DCS gas is more preferably set to be 0.5 to 3 slm. This flow rate range makes it possible to promote DCS adsorption onto the wafers W.

The pressure of the process field 5 is preferably set to be 0.133 Pa to 13.3 kPa. This pressure range makes it possible to promote DCS adsorption onto the wafers W. The pressure of the process field 5 is more preferably set to be 40 to 800 Pa. This pressure range makes it possible to easily control the pressure of the process field 5.

After DCS gas is supplied for a predetermined time period, the supply of DCS gas is stopped. On the other hand, nitrogen gas is kept supplied into the process field 5 at a predetermined flow rate, as shown in FIG. 5, (c). Further, the process field 5 is exhausted to exhaust gas therein out of the process field 5 (purge step).

In the nitridation stage subsequently performed, at first, while nitrogen gas is supplied into the process field 5 at a predetermined flow rate, as shown in FIG. 5, (c), the process field 5 is set at a predetermined temperature, such as 550° C., as shown in FIG. 5, (a). At this time, the process field 5 is exhausted to set the process field 5 at a predetermined pressure, such as 45 Pa (0.34 Torr), as shown in FIG. 5, (b). These operations are continued until the process field 5 is stabilized at the predetermined pressure and temperature (stabilization step).

When the process field 5 is stabilized at the predetermined pressure and temperature, an RF power is applied between the electrodes 11 (RF: ON), as shown in FIG. 5, (g). Further, ammonia gas is supplied to a position between the electrodes 11 (in the gas exciting section 66) at a predetermined flow rate, such as 1 slm, as shown in FIG. 5, (e). Ammonia gas thus supplied is excited (activated) into plasma between the electrodes 11 and generates radicals containing nitrogen atoms (N*, NH*, NH$_2$*, NH$_3$*). The radicals containing nitrogen atoms thus generated are supplied from the gas exciting section 66 into the process field 5. Further, nitrogen gas is also supplied into the process field 5 at a predetermined flow rate, as shown in FIG. 5, (c) (flow step).

The flow rate of ammonia gas is preferably set to be 10 sccm to 50 slm. This flow rate range makes it possible to generate plasma without difficulty and to supply radicals sufficient to nitride Si in the adsorption layer on the wafers W. The flow rate of ammonia gas is more preferably set to be 0.5 to 5 slm. This flow rate range makes it possible to stably generate plasma.

The RF power is preferably set to be 10 to 1,500 W. If the power is lower than 10 W, it is difficult to generate radicals. If the power is higher than 1,500 W, the quartz (or silicon carbide) wall of the gas exciting section 66 may be damaged. The RF power is more preferably set to be 50 to 500 W, and furthermore preferably to be 100 to 500 W. This power range makes it possible to efficiently generate radicals.

The pressure of the process field 5 is preferably set to be 0.133 Pa to 13.3 kPa. This pressure range makes it possible to easily generate radicals and to increase the mean free path of radicals in the process field 5. The pressure of the process field 5 is more preferably set to be 40 to 400 Pa. This pressure range makes it possible to easily control the pressure of the process field 5.

After ammonia gas is supplied for a predetermined time period, the supply of ammonia gas is stopped and the application of RF power is stopped. On the other hand, nitrogen gas is kept supplied into the process field 5 at a predetermined flow rate, as shown in FIG. 5, (c). Further, the process field 5 is exhausted to exhaust gas therein out of the process field 5 (purge step).

As described above, the film formation method according to this embodiment is arranged to alternately repeat a cycle comprising adsorption and nitridation stages in this orders, e.g., M=100 times (see FIG. 4). In each cycle, DCS is supplied onto the wafers W to form a DCS adsorption layer, and then radicals containing nitrogen atoms are supplied to nitride the adsorption layer, so as to form a silicon nitride film. As a result, a silicon nitride film of high quality can be formed with high efficiency.

When the silicon nitride film formed on the surface of the semiconductor wafers W reaches a predetermined thickness, the wafers W are unloaded. Specifically, nitrogen is supplied into the process field 5 at a predetermined flow rate, so that the pressure inside the process field 5 is returned to atmospheric pressure, and the process field 5 is set at a predetermined temperature. Then, the lid 18 is moved down by the boat elevator 25, and the wafer boat 12 is thereby unloaded out of the process container 4, along with the wafers W.

[Auxiliary Process]

Repeating this film formation process a plurality of times, silicon nitride produced by the film formation process is deposited (adhered) not only on the surface of semiconductor wafers W, but also on the inner surface of the process container 4 and so forth, as by-product films. Accordingly, after the film formation process is repeated a plurality of times (an N-number of times in FIG. 4), an auxiliary process for preventing particle generation is performed as follows on the by-product films, which contain silicon nitride as the main component (it means 50% or more), deposited on the inner surface of the process container 4 and so forth. The auxiliary process is performed before the by-product films deposited on the inner surface of the process container 4 and so forth exceed a predetermined film thickness. In this embodiment, a process recipe is stored in the recipe storage portion 111 to execute the auxiliary process before the cumulative film thickness of silicon nitride films exceeds a predetermined value.

The cumulative film thickness is defined by the total film thickness of silicon nitride films accumulated by repeating the film formation process a plurality of times. For example, where a film formation process for forming a 30-nm silicon nitride film on semiconductor wafers W is repeated ten times, the cumulative film thickness is expressed by 0.03×10=0.3 μm. The predetermined value of the cumulative film thickness is a value determined in accordance with the type of a thin film formed on target substrates and the type of a film formation gas. If film formation of a thin film on target substrates is continued after the cumulative film thickness exceeds this predetermined value, by-product films deposited on the inner surface of the process container A and so forth can be easily peeled off (or generate cracks), thereby generating particles.

When the auxiliary process is performed, after wafers W are unloaded, the wafer boat 12 used in the former process is set in an empty state with no wafers W placed thereon. Then, this empty wafer boat 12 is loaded into the process container 4, and the process container 4 is airtightly closed. Thereafter, an oxidation stage for oxidizing the by-product films and a surface nitridation stage for nitriding the surface of the oxidized by-product films are sequentially performed in this order.

In the auxiliary process, the temperature of the process field 5 is preferably set to be closer to the temperature used for the film formation process. This facilitates the temperature control. Specifically, in the auxiliary process, the temperature inside the process container 4 (the temperature of the container inner surface) is set to be 25° C. (room temperature) to 800° C., preferably to be 100 to 800° C., and more preferably to be 400 to 650° C. For example, the temperature inside the process container 4 may be maintained at 550° C. through the film formation process and the auxiliary process including the unload step and load step described above.

In the oxidation stage, at first, while nitrogen gas is supplied into the process container 4 at a predetermined flow rate, as shown in FIG. 5, (c), the process container 4 is set at a predetermined temperature, such as 550° C., as shown in FIG. 5, (a). At this time, the process container 4 is exhausted to set the process container 4 at a predetermined pressure, such as 100 Pa, as shown in FIG. 5, (b).

Then, an RF power is applied between the electrodes 11 (RF: ON), as shown in FIG. 5, (g). Further, oxygen gas is supplied to a position between the electrodes 11 (in the gas exciting section 66) at a predetermined flow rate, such as 3 slm, as shown in FIG. 5, (f). Oxygen gas thus supplied is excited (activated) into plasma between the electrodes 11 and generates radicals containing oxygen atoms ($O^*$ and $O_2^*$). The radicals containing oxygen atoms thus generated are supplied from the gas exciting section 66 into the process container 4. Further, nitrogen gas is also supplied into the process container 4 at a predetermined flow rate, as shown in FIG. 5, (c) (flow step).

The flow rate of oxygen gas is preferably set to be 1 sccm to 10 slm. This flow rate range makes it possible to generate plasma without difficulty and to supply radicals sufficient to perform an oxidation process on the by-product films. The flow rate of oxygen gas is more preferably set to be 1 to 5 slm. This flow rate range makes it possible to stably generate oxygen plasma.

The RF power is preferably set to be 10 to 1,500 W. If the power is lower than 10 W, it is difficult to generate radicals. If the power is higher than 1,500 W, the quartz (or silicon carbide) wall of the gas exciting section 66 may be damaged. The RF power is more preferably set to be 50 to 500 W, and furthermore preferably to be 100 to 500 W. This power range makes it possible to efficiently generate radicals.

The pressure inside the process container 4 is preferably set to be 0.133 Pa to 13.3 kPa. This pressure range makes it possible to easily generate radicals and to increase the mean free path of radicals in the process container 4. The pressure inside the process container 4 is more preferably set to be 30 to 300 Pa. This pressure range makes it possible to easily control the pressure inside the process container A.

Radicals containing oxygen atoms thus supplied onto the wafers W are used to oxidize the by-product films, which contain silicon nitride as the main component, deposited on the inner surface of the process container 4 and so forth. The process conditions of the oxidation stage are set to, change the by-product films into a composition richer in oxygen than nitrogen (silicon oxide or silicon oxynitride), at a part of the by-product films from a surface thereof to a sufficient depth.

In the oxidation stage, the depth of the by-product films to be oxidized is set to be larger than 1 nm, and preferably to be larger than 2 nm. If this depth (i.e., the thickness of an oxide or oxynitride film to be formed) is smaller than 1 nm, the effect of suppressing the stress becomes insufficient. On the other hand, the depth of the by-product films to be oxidized is set to be smaller than 10 nm, and preferably to be smaller than 5 nm. If this depth is larger than 10 nm, the oxidation time is prolonged too much, thereby deteriorating the throughput of the apparatus. Where the by-product films have a thickness small than this upper limit (10 nm, preferably 5 nm), the by-product films is changed into a composition richer in oxygen than nitrogen essentially all over a depth thereof.

After oxygen gas is supplied for a predetermined time period, the supply of oxygen gas is stopped and the application of RF power is stopped. On the other hand, nitrogen gas is kept supplied into the process container 4 at a predetermined flow rate, as shown in FIG. 5, (c). Further, the process container 4 is exhausted to exhaust gas therein out of the process container 4 (purge step).

In the surface nitridation stage subsequently performed, at first, while nitrogen gas is supplied into the process container 4 at a predetermined flow rate, as shown in FIG. 5, (c), the process container 4 is set at a predetermined temperature, such as 550° C., as shown in FIG. 5, (a). At this time, the process container 4 is exhausted to set the process container 4 at a predetermined pressure, such as 75 Pa, as shown in FIG. 5, (b).

Then, an RF power is applied between the electrodes 11 (RF: ON), as shown in FIG. 5, (g). Further, ammonia gas is supplied to a position between the electrodes 11 (in the gas exciting section 66) at a predetermined flow rate, such as 3 slm, as shown in FIG. 5, (e). Ammonia gas thus supplied is excited (activated) into plasma between the electrodes 11 and generates radicals containing nitrogen atoms ($N^*$, $NH^*$, $NH_2^*$, $NH_3^*$). The radicals containing nitrogen atoms thus generated are supplied from the gas exciting section 66 into the process container 4. Further, nitrogen gas is also supplied into the process container 4 at a predetermined flow rate, as shown in FIG. 5, (c) (flow step).

The flow rate of ammonia gas is preferably set to be 10 sccm to 50 slm. This flow rate range makes it possible to generate plasma without difficulty and to supply radicals sufficient to nitride a surface layer of the oxidized by-product films. The flow rate of ammonia gas is more preferably set to be 1 to 5 slm. This flow rate range makes it possible to stably generate ammonia plasma.

The RF power is preferably set to be 10 to 1,500 W. If the power is lower than 10 W, it is difficult to generate radicals. If the power is higher than 1,500 W, the quartz (or silicon carbide) wall of the gas exciting section 66 may be damaged. The RF power is more preferably set to be 50 to 500 W, and furthermore preferably to be 100 to 500 W. This power range makes it possible to efficiently generate radicals.

The pressure inside the process container 4 is preferably set to be 0.133 Pa to 13.3 kPa. This pressure range makes it possible to easily generate radicals and to increase the mean free path of radicals in the process container 4. The pressure inside the process container 4 is more preferably set to be 50 to 100 Pa. This pressure range makes it possible to easily control the pressure inside the process container 4.

Radicals containing nitrogen atoms thus supplied onto the wafers W are used to nitride a surface layer of the oxidized by-product films (silicon oxide or silicon oxynitride). The process conditions of the nitridation stage are set to nitride and return a surface layer (with a thickness of 0.1 to 1 nm, preferably of 0.1 to 0.5 nm, and more preferably of 0.2 to 0.5 nm) of the oxidized by-product films into a composition richer in nitrogen than oxygen.

The by-product films processed by the oxidation and nitridation stages has a structure in which the inside is made of silicon oxide or the like and the surface layer is made of silicon nitride. As compared to silicon nitride, silicon oxide or silicon oxynitride has a smaller difference in coefficient of thermal expansion from the quartz (or silicon carbide) of the process container 4 and so forth. Accordingly, for example, even if the temperature inside the process container 4 becomes low, film peeling can be hardly caused, because the film contraction rate and film stress of the by-product films are alleviated. In other words, the limit value of the cumulative film thickness of silicon nitride films becomes higher. Consequently, it is possible to prevent particle generation without lowering the productivity.

Further, the surface of the by-product films thus processed is made of SiN and thus less affects formation of a silicon nitride film in the film formation process performed after the auxiliary process. Accordingly, it is possible to maintain the reproducibility of the film formation process.

After ammonia gas is supplied for a predetermined time period, the supply of ammonia gas is stopped and the application of RF power is stopped. On the other hand, nitrogen gas is kept supplied into the process container 4 at a predetermined flow rate, as shown in FIG. 5, (c). Further, the process container 4 is exhausted to exhaust gas therein out of the process container 4 (purge step).

Then, nitrogen is supplied into the process field 5 at a predetermined flow rate, so that the pressure inside the process container 4 is returned to atmospheric pressure, and the process container 4 is set at a predetermined temperature. Then, the lid 18 is moved down by the boat elevator 25, and the empty wafer boat 12 is thereby unloaded out of the process container 4.

[After Auxiliary Process]

Since the limit value of the cumulative film thickness of silicon nitride films has become larger, the film formation process (FILM FORMATION PROCESS N+1) can be performed again as shown in FIG. 4, under the conditions shown in FIG. 5. Thereafter, the auxiliary process is performed again before the cumulative film thickness of silicon nitride films exceeds another predetermined value, for example, immediately after a repetition of, the film formation process reaches FILM FORMATION PROCESS 2N. The film formation process and auxiliary process are repeated up to FILM FORMATION PROCESS XN, as shown in FIG. 4.

As described above, the film formation process for forming a silicon nitride film can be continuously repeated without removing by-product films deposited on the inner surface of the process container 4 and so forth. Consequently, the number of repetition of the film formation process for forming a silicon nitride film is increased within a given time, thereby preventing particle generation without lowering the productivity.

In order to confirm an effect of this embodiment, an experiment was conducted in terms of the limit value of the cumulative film thickness of silicon nitride films obtained by the auxiliary process. At this time, the process conditions were set in accordance with those described in the embodiment. Where no auxiliary process was performed, the limit value of the cumulative film thickness was 0.3 to 0.8 μm. On the other hand, where the auxiliary process was performed, the limit value of the cumulative film thickness was 1.0 to 8 μm, which was 3 to 10 times larger than that obtained in the case of no auxiliary process being performed.

[Another Embodiment]

Figure 6:
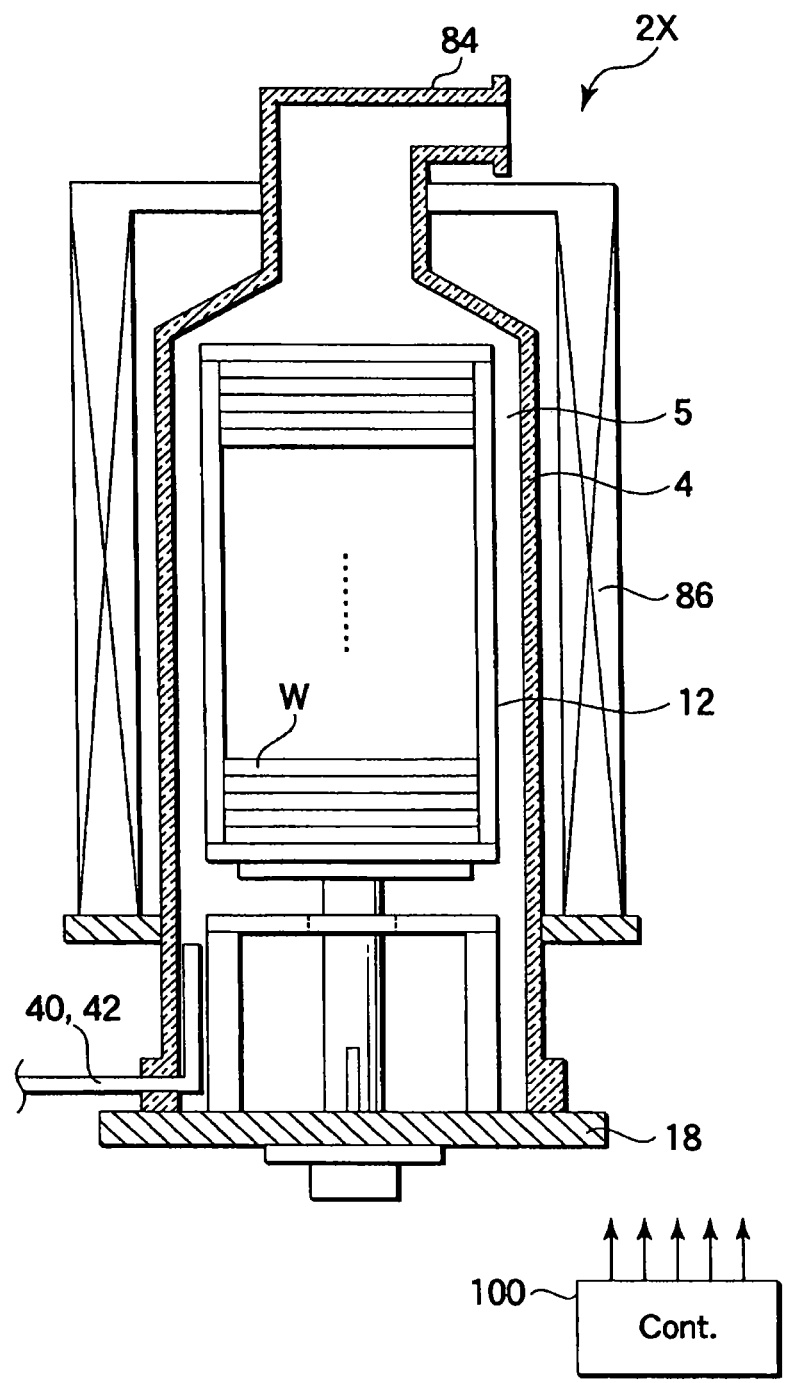
FIG. 6 is a sectional view showing a film formation apparatus (vertical thermal CVD apparatus) according to another embodiment of the present invention.

FIG. 6 is a sectional view showing a film formation apparatus (vertical thermal CVD apparatus) according to another embodiment of the present invention. In order to activate a nitriding gas and an oxidizing gas, another medium, such as catalyst, UV, heat, or magnetic force, may be used in place of plasma described in the former embodiment. For example, where a process gas is activated by heat, the heat processing apparatus shown in FIG. 6 may be used.

In the film formation apparatus 2X shown in FIG. 6, an gas outlet 84 is formed at the top of a process container, and connected to a vacuum-exhaust system, while short L-shape nozzles 40 and 42 are connected near the bottom of the process container 4. Accordingly, process gases are supplied from the supply ports of the nozzles 40 and 42 located below a process field 5, in which a wafer boat 12 supporting wafers W is placed, and then flow through the process field 5 until they are exhausted from the gas outlet 84 at the top. The nozzle 40 is connected to a supply circuit of the first process gas comprising a silicon source gas and a supply circuit of an inactive gas. The nozzle 42 is connected to a supply circuit of the second process gas comprising a nitriding gas and a supply circuit of the third process gas comprising an oxidizing gas. The process container 4 is surrounded by a heater 86, which is used for heating the process field 5.

Where this heat processing apparatus is used, a process gas is supplied to the process field 5 heated at a predetermined temperature, and is thereby activated. The temperature of the process field 5 is set at a value that can activate the process gas.

[Modification]

In the embodiments described above, oxygen (oxygen radicals) is used as an oxidizing gas in the oxidation stage of the auxiliary process. In this respect, the oxidizing gas may comprise one or more gases selected from the group consisting of oxygen, ozone ($O_3$), and water vapor ($H_2O$). Where ozone is used to oxidize by-product films, an ozonizer may be disposed outside the process container 4 to supply ozone into the process container 4. Further, the temperature inside the process container 4 (the temperature of the container inner surface) is set to be 400 to 800° C., and preferably to be 400 to 550° C. This temperature range makes it possible to oxidize by-product films without deactivating ozone.

In the embodiments described above, the auxiliary process includes, after the oxidation stage, the nitridation stage for nitriding the surface of the oxidized by-product films. However, even if no nitridation stage is performed, it is possible to prevent particle generation without lowering the productivity.

In the embodiments described above, DCS and ammonia are used as film formation gases. Alternatively, for example, hexachlorodisilane (HCD) and ammonia may be used for the same purpose. The nitriding gas may comprise a nitrogen oxide, such as $N_2O$, NO, or $NO_2$, in place of ammonia.

In the embodiments described above, nitrogen gas is supplied as a dilution gas when each of the process gases, such as DCS gas, is supplied. In this respect, no nitrogen gas may be supplied when each of the process gases is supplied. However, each of the process gases preferably contains nitrogen gas as a dilution gas, because the process time can be more easily controlled if it is so arranged. The dilution gas consists preferably of an inactive gas, such as nitrogen gas, or helium gas (He), neon gas (Ne), argon gas (Ar), or xenon gas (Xe) in place of nitrogen gas.

In the embodiments described above, DCS gas and nitrogen gas are supplied through a common gas supply nozzle, and ammonia gas and oxygen gas are supplied through a common gas supply nozzle. Alternatively, gas supply nozzles may be respectively disposed in accordance with the types of gases. Further, a plurality of gas supply nozzles may be connected to the sidewall of the process container 4 near the bottom, to supply each gas through a plurality of nozzles. In this case, a process gas is supplied through a plurality of gas supply nozzles into the process container 4, and thereby more uniformly spreads in the process container 4.

In the embodiments described above, the film formation apparatus employed is a heat processing apparatus of the batch type having a single-tube structure. However, for example, the present invention may be applied to a vertical heat processing apparatus of the batch type having a process container of the double-tube type, which is formed of inner and outer tubes. Alternatively, the present invention may be applied to a heat processing apparatus of the single-substrate type. The target substrate is not limited to a semiconductor wafer W, and it may be a glass substrate for, e.g., an LCD.

The control section 100 of the film formation apparatus is not limited to a specific system, and it may be realized by an ordinary computer system. For example, a program for executing the process described above may be installed into a multi-purpose computer, using a storage medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined storage medium, as described above. In this case, for example, a program may be pasted on a bulletin board (BBS) on a communication network, and then supplied through a network while being superimposed on a carrier wave. The program thus provided would then be activated and ran under the control of the OS of the computer, as in other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A silicon nitride film formation apparatus, comprising:
a process container configured to accommodate a plurality of target substrates at intervals in a vertical direction and having an inner surface, which contains as a main component a material selected from the group consisting of quartz and silicon carbide;
a heater disposed around the process container to heat the target substrates inside the process container;
an exhaust system configured to exhaust gas from inside the process container;
a gas supply system configured to supply a silicon source gas, ammonia gas, and an oxidizing gas into the process container;
a mechanism configured to load and unload the target substrates to and from the process container; and
a control section configured to control an operation of the apparatus, the control section including a non-transitory computer readable storage medium storing program instructions, which when executed cause the control section to control the apparatus to conduct a process sequence,
wherein the process sequence uses a film formation process and an auxiliary process such that
the film formation process supplies the silicon source gas and the ammonia gas into the process container to form a silicon nitride film on each of the target substrates by CVD, and
the auxiliary process processes by-product films deposited on the inner surface of the process container due to the film formation process, without removing the by-product films, to prevent particle generation from the by-product films, and
the process sequence includes:
a phase of performing the film formation process repeatedly an N-number of times, without interposing the auxiliary process therebetween, respectively on an N-number of lots of target substrates inside the process container;
then a phase of performing the auxiliary process inside the process container with no target substrates accommodated therein; and
then a phase of performing the film formation process repeatedly an N-number of times, without interposing the auxiliary process therebetween, respectively on another N-number of lots of target substrates inside the process container, and
wherein the auxiliary process includes:
supplying the oxidizing gas into the process container with no target substrates accommodated therein while heating the inner surface of the process container, thereby performing an oxidation step to change a part of the by-product films into a composition richer in oxygen than nitrogen, the part of the by-product films being from a surface thereof to a predetermined depth of 2 to 10 nm; and
then supplying the ammonia gas into the process container with no target substrates accommodated therein while heating the inner surface of the process container, thereby performing a nitridation step to return a surface layer of the oxidized by-product films into a composition richer in nitrogen than oxygen, the surface layer having a thickness of 0.1 to 1 nm.

2. The apparatus according to claim 1, wherein the surface layer processed by the nitridation step of the auxiliary process has a thickness smaller than 0.5 nm.

3. The apparatus according to claim 1, wherein, before first performing the film formation process repeatedly an N-number of times, the process sequence includes determining and incorporating a value of the N-number of times in the process sequence by use of a cumulative film thickness as an indicator for a thickness of the by-product films to prevent particle generation from the by-product films, the cumulative film thickness being defined by a repetition number of the film formation process multiplied by a thickness of the silicon nitride film obtained by performing the film formation process once.

4. The apparatus according to claim 3, wherein the value of the N-number of times is set to cause the cumulative film thickness to be a value of 0.3 to 0.8 μm.

5. The apparatus according to claim 3, wherein the process sequence alternately repeats a phase of performing the film formation process repeatedly on an N-number of lots of target substrates and a phase of performing the auxiliary process, without removing the by-product films, until the cumulative film thickness reaches a value of 1 to 8 μm.

6. The apparatus according to claim 1, wherein the apparatus further comprises a plasma exciting mechanism attached to the process container to turn gas into plasma, the film formation process includes turning the ammonia gas into plasma, and the oxidation and nitridation steps of the auxiliary process respectively include turning the oxidizing gas and the ammonia gas into plasma.

7. The apparatus according to claim 6, wherein the oxidizing gas contains oxygen gas.

8. The apparatus according to claim 6, wherein the process sequence essentially maintains a temperature inside the process container at a temperature of 400 to 650° C. through the film formation process and the auxiliary process.

9. The apparatus according to claim 1, wherein the predetermined depth has a value smaller than 5 nm.

10. The apparatus according to claim 1, wherein the process sequence performs the film formation process inside the process container with a holder placed therein and holding each lot of target substrates, and performs the auxiliary process inside the process container with the holder placed therein and holding no target substrates, the holder being formed of a material selected from the group consisting of quartz and silicon carbide.

* * * * *